(12) United States Patent
Ueno

(10) Patent No.: US 10,551,697 B2
(45) Date of Patent: Feb. 4, 2020

(54) ELECTROOPTIC DISPLAY DEVICE

(71) Applicant: Mitsubishi Electric Corporation, Tokyo (JP)

(72) Inventor: Takahiro Ueno, Kumamoto (JP)

(73) Assignee: Mitsubishi Electric Corporation, Tokyo (JP)

( * ) Notice: Subject to any disclaimer, the term of this patent is extended or adjusted under 35 U.S.C. 154(b) by 43 days.

(21) Appl. No.: 15/719,919

(22) Filed: Sep. 29, 2017

(65) Prior Publication Data

US 2018/0113342 A1 Apr. 26, 2018

(30) Foreign Application Priority Data

Oct. 21, 2016 (JP) ................. 2016-206588

(51) Int. Cl.
*G02F 1/1345* (2006.01)
*G02F 1/1333* (2006.01)
*H03K 17/96* (2006.01)
*H05K 1/14* (2006.01)
*G02F 1/1368* (2006.01)

(52) U.S. Cl.
CPC .......... *G02F 1/1345* (2013.01); *G02F 1/1368* (2013.01); *G02F 1/13338* (2013.01); *H03K 17/96* (2013.01); *H05K 1/147* (2013.01)

(58) Field of Classification Search
CPC .. G02F 1/1345; G02F 1/1368; G02F 1/13338; H05K 1/147; H03K 17/96
See application file for complete search history.

(56) References Cited

U.S. PATENT DOCUMENTS

| 6,944,030 | B2 * | 9/2005 | Nakayabu | H05K 1/147 361/761 |
| 7,212,413 | B2 * | 5/2007 | Chang | G02F 1/13452 174/254 |
| 8,373,835 | B2 * | 2/2013 | Nobeoka | G02F 1/133308 349/150 |
| 8,382,361 | B2 * | 2/2013 | Park | G02B 6/009 174/254 |
| 8,724,069 | B2 * | 5/2014 | Hatakeyama | G02F 1/1345 349/149 |
| 9,642,257 | B2 * | 5/2017 | Kuriyama | H05K 1/148 |
| 9,992,862 | B2 * | 6/2018 | Shin | H05K 1/028 |
| 10,314,180 | B2 * | 6/2019 | Wang | G02F 1/13 |
| 2011/0141042 | A1 * | 6/2011 | Kim | G02F 1/13338 345/173 |

(Continued)

FOREIGN PATENT DOCUMENTS

| JP | 2014-063484 A | 4/2014 |
| WO | 2011/104934 A1 | 9/2011 |

*Primary Examiner* — Nathan Milakovich
(74) *Attorney, Agent, or Firm* — Studebaker & Brackett PC

(57) ABSTRACT

An electrooptic display device includes a TFT substrate, a touch panel superimposed and placed on the TFT substrate, a circuit board spaced apart from the TFT substrate and the touch panel, one side of the circuit board facing the TFT substrate and the touch panel, a plurality of first FPCs each including one end electrically connected to one side of the TFT substrate, and the other end electrically connected to one side of the circuit board, and a second FPC that is electrically connected to the touch panel and extends in parallel to the first FPCs. The circuit board includes a cutout in a portion overlapping the second FPC on one side of the circuit board.

13 Claims, 5 Drawing Sheets

(56) References Cited

U.S. PATENT DOCUMENTS

2012/0320290 A1    12/2012  Hida et al.
2014/0063364 A1     3/2014  Hirakata
2016/0147345 A1*    5/2016  Lee ..................... G06F 3/0412
                                                         345/173

* cited by examiner

F I G. 1
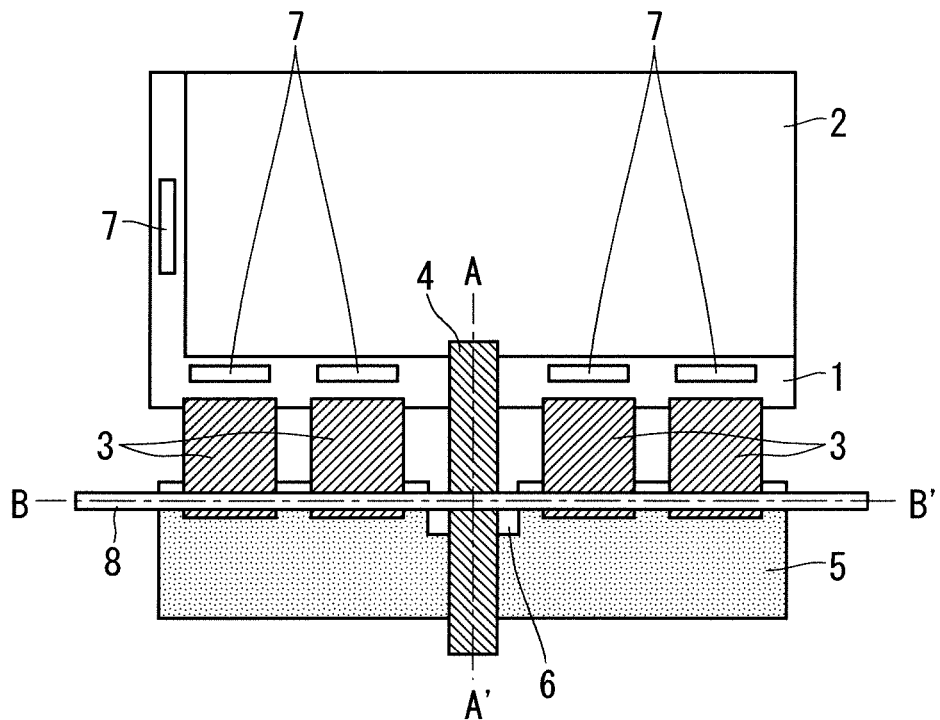
F I G. 2
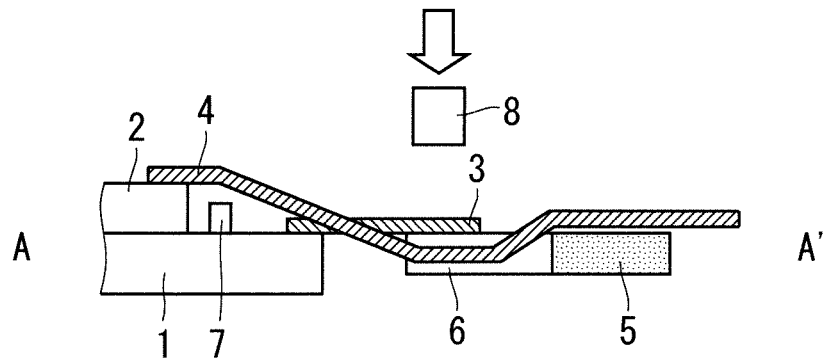

ELECTROOPTIC DISPLAY DEVICE

BACKGROUND OF THE INVENTION

Field of the Invention

The present invention relates to an electrooptic display device. Examples of the electrooptic display device include a flat panel display device represented by a liquid crystal display device, a plasma display device, an organic electro luminescence (EL) display device, and a field emission display device. In addition, another example of the electrooptic display device is a touch panel display device including a touch panel on the flat panel display device.

Description of the Background Art

In recent years, touch panel display devices, such as a tablet terminal, have been used in increasingly many applications. In a liquid crystal display device that constitutes a display device, techniques such as an on-cell structure or an in-cell structure are advancing rapidly. While the on-cell structure or the in-cell structure is a technique that leads to product differentiation caused by added values, it is difficult to produce such a structure in a manufacturing process for producing the structure commercially.

In the on-cell structure or the in-cell structure, it is necessary to connect separate flexible printed circuit boards (FPCs) to wiring provided on a thin film transistor (TFT) side of the liquid crystal display (LCD) panel and touch panel (TP) wiring provided on a color filter (CF) side. The FPC connected to the wiring provided on the TFT side of the LCD is hereinafter referred to as an LCD-FPC. The FPC connected to the TP wiring is referred to as a TP-FPC.

Typically, a method of not placing the FPCs on an identical side of a display device so as to prevent the LCD-FPC and the TP-FPC from overlapping each other is known (for example, refer to Japanese Patent Application Laid-Open No. 2014-63484). Although this method has an advantage that it is relatively easy to connect the LCD-FPC and the TP-FPC, since the LCD-FPC and the TP-FPC are connected to two sides of the display device (two sides different from each other), the method has a problem that a bezel of the display device may be enlarged.

To address this problem, the LCD-FPC and the TP-FPC may be placed on an identical side of a display device as another method (e.g. refer to WO 2011/104934). In this method, typically, after the LCD-FPC is connected, the TP-FPC is connected.

SUMMARY OF THE INVENTION

In the case where the display device is large with high resolution, as the number of LCD-FPCs and TP-FPCs increases, a connection area may also increase and each LCD-FPC and TP-FPC may further be enlarged. In the case where the LCD-FPC and the TP-FPC are placed on an identical side of a display device, the LCD-FPC is segmented into small pieces, and after one end is connected to the wiring provided on the TFT side, the other end may be connected to a circuit board as one method. However, in this method, since the TP-FPC may inhibit connection between the LCD-FPC and the circuit board, it is necessary to fully consider placement of the LCD-FPC and the TP-FPC during design of the display device.

Moreover, in this method, from a viewpoint of productivity, crimping and connecting the LCD-FPC segmented into small pieces and the circuit board by one operation using a long crimping tool is the most efficient method. However, if the TP-FPC is present on the circuit board during the crimping connection, the TP-FPC may be crimped together with the LCD-FPC, and the crimping tool may not be able to sufficiently apply pressure to the LCD-FPC and the circuit board which are originally to be crimped, thereby generating poor connection. Moreover, there is a concern that the crimping tool touching the TP-FPC during the crimping connection may result in breaking of or damage to wiring within the TP-FPC. Thus, an FPC inhibits connection between another FPC and a circuit board in some cases.

An object of the present invention is to provide an electrooptic display device capable of preventing an FPC from inhibiting connection between another FPC and a circuit board.

An electrooptic display device includes: a first substrate; a second substrate superimposed and placed on the first substrate; a third substrate spaced apart from the first substrate and the second substrate, one side of the third substrate facing the first substrate and the second substrate; a plurality of first flexible printed circuit boards each including one end electrically connected to one side of the first substrate and another end electrically connected to one side of the third substrate; and a second flexible printed circuit board electrically connected to the second substrate, the second flexible printed circuit board extending in parallel to the first flexible printed circuit boards. The third substrate includes a cutout in a portion overlapping the second flexible printed circuit board on one side of the third substrate.

These and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a plan view illustrating one example of a configuration of a touch panel display device according to a first preferred embodiment of the present invention;

FIGS. 2 and 3 are cross-sectional views each illustrating one example of the configuration of the touch panel display device according to the first preferred embodiment of the present invention;

DESCRIPTION OF THE PREFERRED EMBODIMENTS

Preferred embodiments of the present invention will be described below with reference to the drawings. The preferred embodiments of the present invention will describe a touch panel display device as one example of an electrooptic display device.

First Preferred Embodiment

Figure 3:
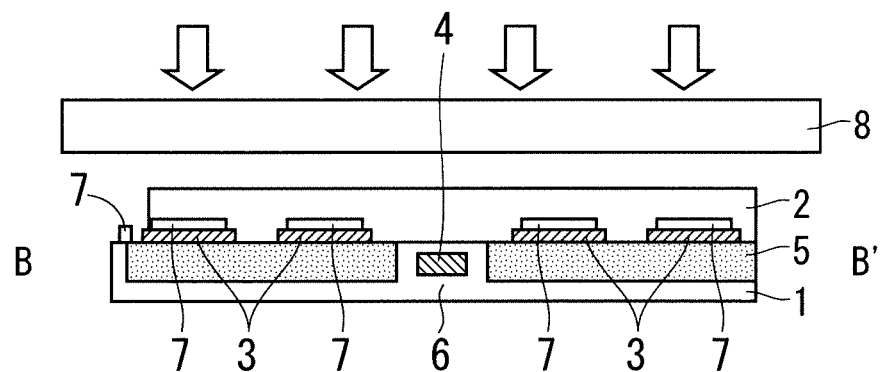

FIG. 1 is a plan view illustrating one example of a configuration of a touch panel display device according to a first preferred embodiment of the present invention. FIG. 2 is a cross-sectional view taken along line A-A' of FIG. 1. FIG. 3 is a cross-sectional view taken along line B-B' of FIG. 1.

The touch panel display device includes a TFT substrate 1 that is a first substrate, a touch panel 2 that is a second substrate, FPCs 3 that are a plurality of first flexible printed circuit boards, an FPC 4 that is a second flexible printed circuit board, a circuit board 5 that is a third substrate, and large scale integrated circuits (LSIs) 7. The touch panel 2 is formed on an unillustrated CF substrate superimposed and placed on the TFT substrate 1. The LSIs 7 are provided on the TFT substrate 1.

One end of each FPC 3 is electrically connected to one side of the TFT substrate 1, whereas the other end is electrically connected to one side of the circuit board 5. More specifically, each FPC 3 extends outward from one side of the TFT substrate 1 in an identical direction. The FPC 4 is electrically connected to the touch panel 2, is parallel to each FPC 3, and extends at least over one side of the circuit board 5 to which the other end of each FPC 3 is connected. In the example of FIG. 1, the FPC 4 extends over the circuit board 5. The circuit board 5 is spaced apart from the TFT substrate 1 and the touch panel 2, and one side of the circuit board 5 faces the TFT substrate 1 and the touch panel 2. In addition, the circuit board 5 includes a cutout 6 in a portion overlapping the FPC 4 on a side identical to one side to which the other end of each FPC 3 is connected.

A main base material of the TFT substrate 1 and the touch panel 2 is an insulating member that is, for example, glass, plastic, and resin shaped like a film or the like. A main base material of the FPCs 3, the FPC 4, and the circuit board 5 is an insulating member that is, for example, resin shaped like a film or the like or a printed board. Electrodes and the like are formed of a conductive member, such as metal, on the insulating member. For example, the FPCs 3 and the circuit board 5 are electrically connected to each other by applying heat and load, with a crimping tool 8 or the like, on the electrode formed on each of the FPCs 3 and the circuit board 5 by using a conductive resin or the like.

Next, connection of the FPCs 3 and 4 will be described.

First, one end of each FPC 3 is electrically connected to the electrode formed on the TFT substrate 1, and the FPC 4 is electrically connected to the electrode formed on the touch panel 2. Then, the other end of each FPC 3 is electrically connected to the electrode formed on the circuit board 5 by using the crimping tool 8. As illustrated in FIGS. 2 and 3, pressing the crimping tool 8 from above the FPCs 3 applies sufficient heat and load to the FPCs 3 and the circuit board 5, and then the FPCs 3 and the circuit board 5 are electrically connected to each other. Note that in FIGS. 2 and 3, arrows indicate a load direction of the crimping tool 8. When the crimping tool 8 applies load to the FPCs 3 and the circuit board 5, since the FPC 4 has gone into the cutout 6 of the circuit board 5, contact between the FPC 4 and the crimping tool 8 can be avoided.

As described above, according to the present first preferred embodiment, since the FPC 4 has gone into the cutout 6 when the FPCs 3 are connected to the circuit board 5 by using the crimping tool 8, it is possible to keep the FPC 4 from inhibiting connection between the FPCs 3 and the circuit board 5. At this time, since the FPC 4 does not touch the crimping tool 8, breaking of or damage to the FPC 4 caused by touching the crimping tool 8 can be prevented.

Since the crimping tool 8 applies sufficient heat and load to the FPCs 3 and the circuit board 5, poor connection between the FPCs 3 and the circuit board 5 can be prevented. Since the FPCs 3 and the circuit board 5 can be connected by one operation using the existing long crimping tool 8, the number of manufacturing processes of a touch panel display device can be reduced, and it is not necessary to install a new facility for connecting the FPCs 3 and the circuit board 5.

Providing the plurality of FPCs 3 improves design flexibility about placement positions of the FPC 4 and the cutout 6 of the circuit board 5.

<Variation>

Next, a variation of the present first preferred embodiment will be described.

Figure 4:
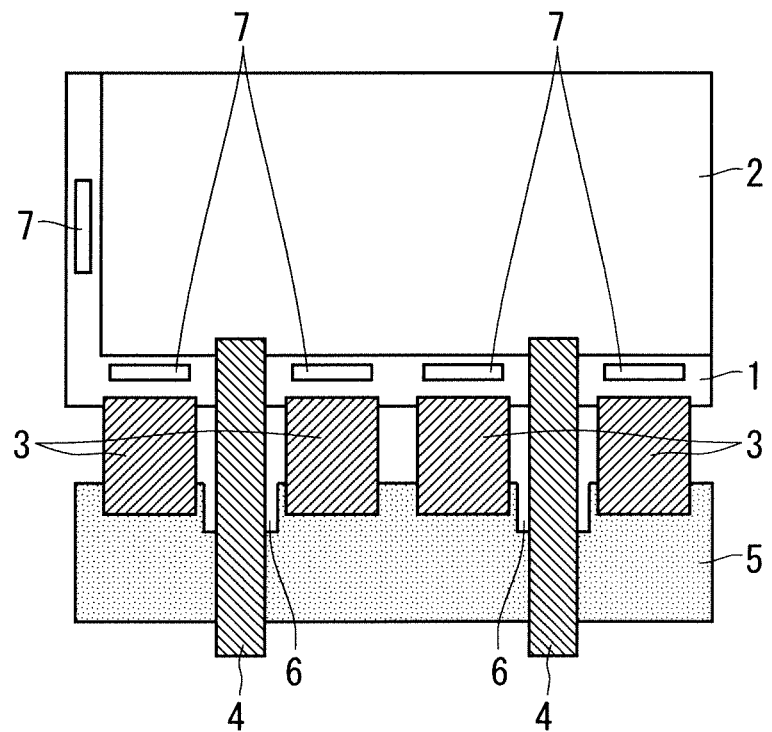
FIG. 4 is a plan view illustrating one example of a configuration of a touch panel display device according to a variation of the first preferred embodiment of the present invention.

FIG. 4 is a plan view illustrating one example of a configuration of a touch panel display device according to the variation. The touch panel display device according to this variation is characterized in that a plurality of FPCs 4 is provided and that a circuit board 5 is provided with cutouts 6 at positions corresponding to the respective FPCs 4. Other configurations are similar to configurations of the touch panel display device according to the first preferred embodiment illustrated in FIGS. 1 to 3, and thus detailed description thereof will be omitted here.

As illustrated in FIG. 4, each FPC 4 is electrically connected to a touch panel 2, is parallel to FPCs 3, and extends at least over one side of the circuit board 5 to which the other end of each FPC 3 is connected. In the example of FIG. 4, the FPCs 4 extend over the circuit board 5. The circuit board 5 includes the cutouts 6 in portions overlapping the respective FPCs 4 on a side identical to one side to which the other end of each FPC 3 is connected.

As described above, an advantageous effect similar to an effect of the first preferred embodiment is obtained, even if the touch panel display device is enlarged with high resolution, or even if the number of FPCs 4 increases because the number of wires to be electrically connected increases due to high resolution of the touch panel.

Second Preferred Embodiment

Figure 5:
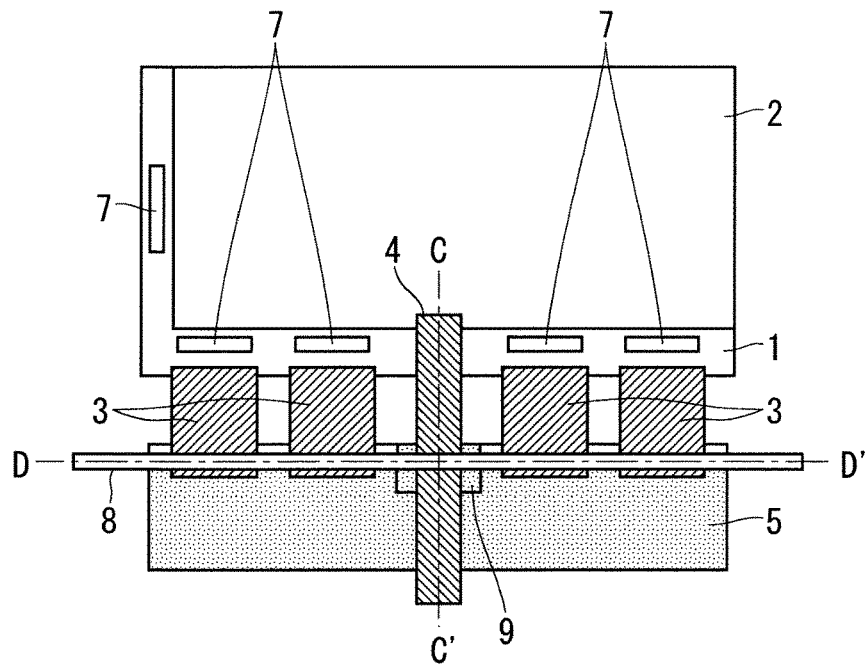
FIG. 5 is a plan view illustrating one example of a configuration of a touch panel display device according to a second preferred embodiment of the present invention.
Figure 6:
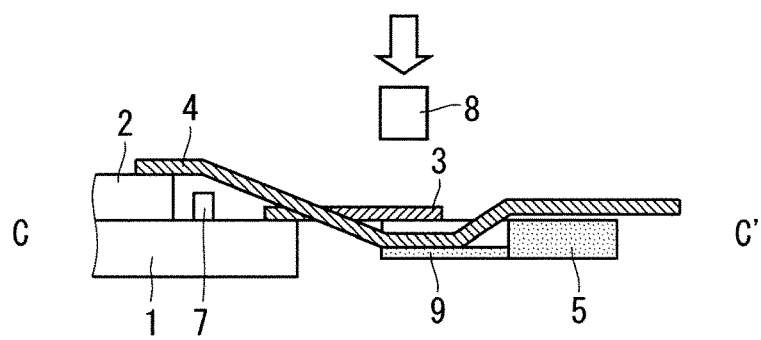
FIGS. 6 to 8 are cross-sectional views each illustrating one example of the configuration of the touch panel display device according to the second preferred embodiment of the present invention.
Figure 7:
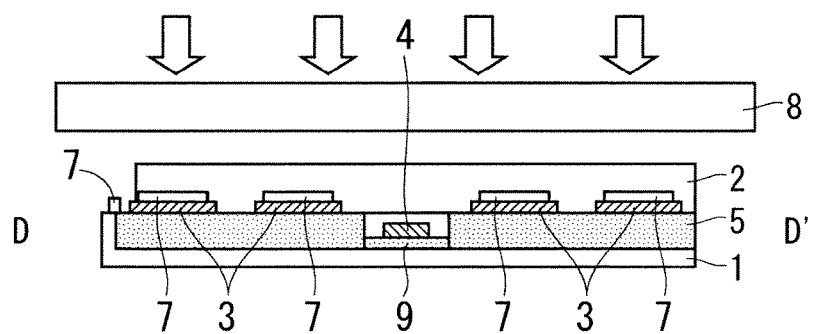

FIG. 5 is a plan view illustrating one example of a configuration of a touch panel display device according to a second preferred embodiment of the present invention. FIG. 6 is a cross-sectional view taken along line C-C' of FIG. 5. FIG. 7 is a cross-sectional view taken along line D-D' of FIG. 5.

As illustrated in FIGS. 5 to 7, the present second preferred embodiment is characterized in that a circuit board 5 includes a recess 9 in a portion overlapping an FPC 4. Other configurations are similar to configurations of the touch panel display device according to the first preferred embodiment illustrated in FIGS. 1 to 3, and thus detailed description thereof will be omitted here. Note that in FIGS. 5 to 7, the same reference numerals are used to refer to components similar to components in FIGS. 1 to 3.

Next, connection of FPCs 3 and 4 will be described.

Figure 8:
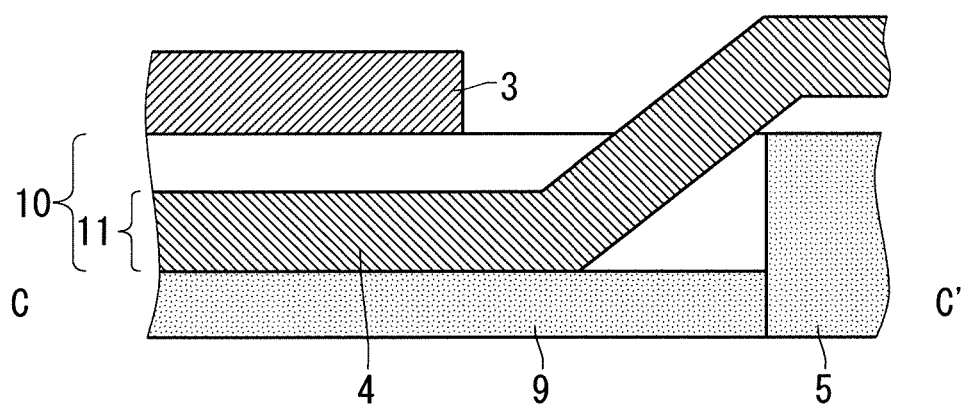

First, one end of each FPC 3 is electrically connected to an electrode formed on a TFT substrate 1, and the FPC 4 is electrically connected to an electrode formed on a touch panel 2. Then, the other end of each FPC 3 is electrically connected to an electrode formed on the circuit board 5 by using a crimping tool 8. As illustrated in FIGS. 6 and 7, pressing the crimping tool 8 from above the FPCs 3 applies sufficient heat and load to the FPCs 3 and the circuit board 5, and then the FPCs 3 and the circuit board 5 are electrically connected to each other. Note that in FIGS. 6 and 7, arrows indicate a load direction of the crimping tool 8. When the crimping tool 8 applies load to the FPC 3 and the circuit board 5, since the FPC 4 has gone into the recess 9 of the circuit board 5, contact between the FPC 4 and the crimping tool 8 can be avoided. As illustrated in FIG. 8, it is necessary to make a depth 10 of the recess 9 deeper than a thickness 11 of the FPC 4.

As described above, according to the present second preferred embodiment, since the FPC 4 has gone into the recess 9 when the FPCs 3 are connected to the circuit board 5 by using the crimping tool 8, it is possible to keep the FPC 4 from inhibiting connection between the FPCs 3 and the circuit board 5. At this time, since the FPC 4 does not touch the crimping tool 8, breaking of or damage to the FPC 4 caused by touching the crimping tool 8 can be prevented.

Since the crimping tool 8 applies sufficient heat and load to the FPCs 3 and the circuit board 5, poor connection between the FPCs 3 and the circuit board 5 can be prevented. Since the FPCs 3 and the circuit board 5 can be connected by one operation using the existing long crimping tool 8, the number of manufacturing processes of a touch panel display device can be reduced, and it is not necessary to install a new facility for connecting the FPCs 3 and the circuit board 5.

Providing the plurality of FPCs 3 improves design flexibility about placement positions of the FPC 4 and the recess 9 of the circuit board 5.

Since an area of the circuit board 5 is not reduced by the recess 9 provided in the circuit board 5, flexibility of wiring design in the circuit board 5 and mechanical strength of the circuit board 5 will be better than in the first preferred embodiment. Since a cutting shape of the circuit board 5 is not complicated, processing man-hours can be reduced.

In the case where tape-shaped conductive resin is pasted in advance on an electrode to which each FPC 3 is to be connected on the circuit board 5, the process of pasting the tape-shaped conductive resin can be simplified.

<Variation>

Next, a variation of the present second preferred embodiment will be described.

Figure 9:
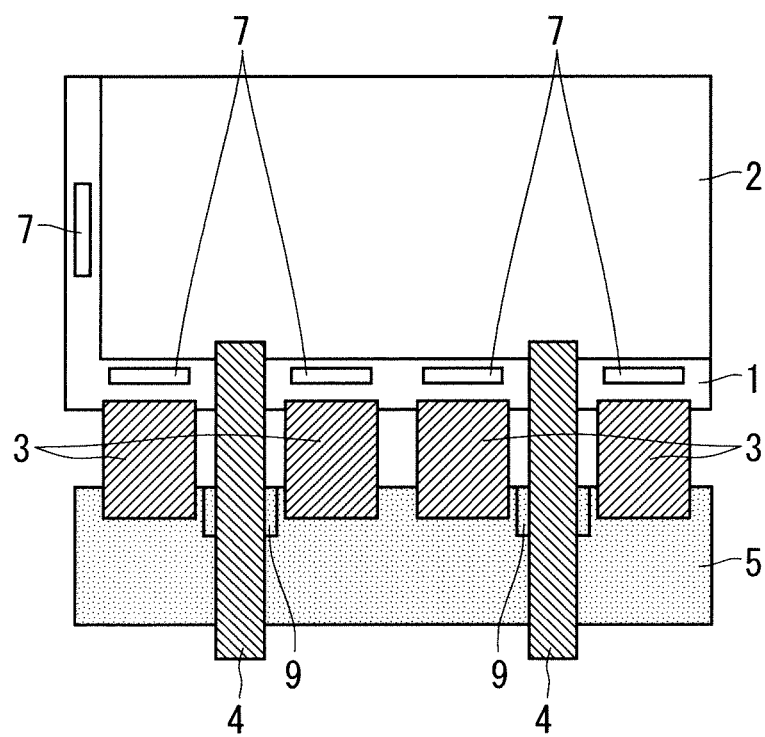
FIGS. 9 and 10 are plan views each illustrating one example of a configuration of a touch panel display device according to a variation of the second preferred embodiment of the present invention.

FIG. 9 is a plan view illustrating one example of a configuration of a touch panel display device according to the variation. The touch panel display device according to the variation illustrated in FIG. 9 is characterized in that a plurality of FPCs 4 is provided and that a circuit board 5 is provided with recesses 9 at positions corresponding to the respective FPCs 4. Other configurations are similar to configurations of the touch panel display device according to the second preferred embodiment illustrated in FIGS. 5 to 7, and thus detailed description thereof will be omitted here.

As illustrated in FIG. 9, each FPC 4 is electrically connected to a touch panel 2, is parallel to each FPC 3, and extends at least over one side of the circuit board 5 to which the other end of each FPC 3 is connected. In the example of FIG. 9, each FPC 4 extends over the circuit board 5. The circuit board 5 includes the recesses 9 in portions overlapping the respective FPCs 4 on a side identical to one side to which the other end of each FPC 3 is connected.

Figure 10:
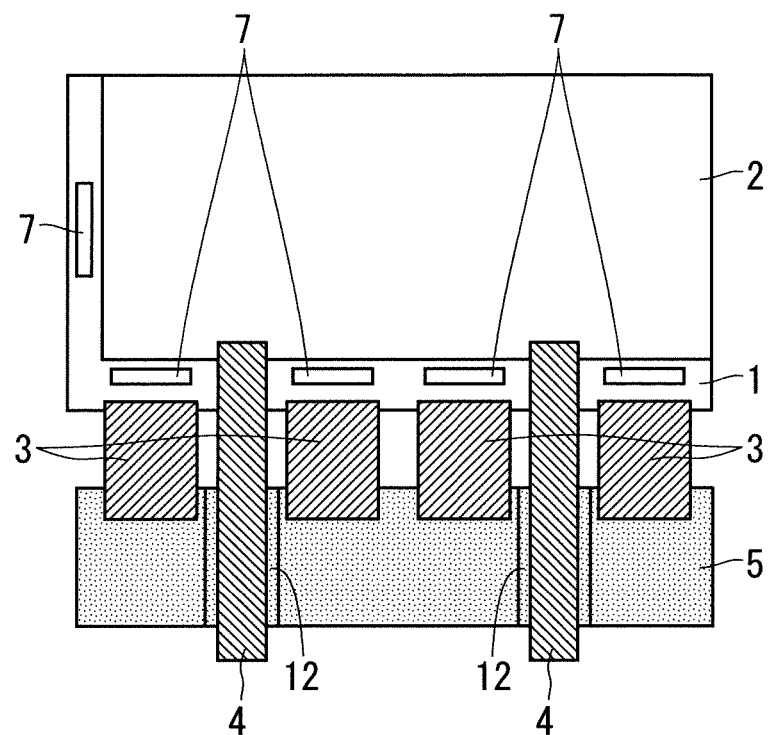

Note that instead of the recesses 9 illustrated in FIG. 9, as illustrated in FIG. 10, the circuit board 5 may be provided with recesses 12 each having a shape along each FPC 4, the recesses 12 extending from one side to which the other end of each FPC 3 is connected to the facing other side. Each of the recesses 12 has a shape into which each FPC 4 fits, and is relatively easy to process.

As described above, an advantageous effect similar to an effect of the second preferred embodiment is obtained, even if the touch panel display device is enlarged with high resolution, or even if the number of FPCs 4 increases because the number of wires to be electrically connected increases due to high resolution of the touch panel.

Note that in the present invention, the preferred embodiments may be arbitrarily combined, or various modifications and omissions may be made to the preferred embodiments as appropriate without departing from the scope of the invention.

While the invention has been shown and described in detail, the foregoing description is in all aspects illustrative and not restrictive. It is therefore understood that numerous modifications and variations can be devised without departing from the scope of the invention.

What is claimed is:

1. An electrooptic display device comprising:
a first substrate;
a second substrate superimposed and placed on a top surface of said first substrate;
a third substrate spaced apart from said first substrate and said second substrate, an edge surface of the third substrate facing said first substrate and said second substrate;
a plurality of first flexible printed circuit boards each including one end electrically connected to the top surface of said first substrate, and another end electrically connected to a top surface of said third substrate; and
a second flexible printed circuit board electrically connected to said second substrate, the second flexible printed circuit board extending in parallel to said first flexible printed circuit boards,
wherein said third substrate includes a cutout in a portion overlapping said second flexible printed circuit board in a plan view,
said second flexible printed circuit board is placed in said cutout so as to extend under said first flexible printed circuit boards when viewed in a cross-sectional direction parallel to the edge surface of said third substrate, and
said second flexible printed circuit board extends over said third substrate.

2. The electrooptic display device according to claim 1, wherein
a plurality of said second flexible printed circuit boards is provided, and
said third substrate includes cutouts in portions overlapping said second flexible printed circuit boards.

3. The electrooptic display device according to claim 1, wherein said first substrate is a thin film transistor (TFT) substrate.

4. The electrooptic display device according to claim 1, wherein said second substrate is a touch panel.

5. The electrooptic display device according to claim 1, wherein said second flexible printed circuit board is placed on the top surface of said third substrate.

6. The electrooptic display device according to claim 1, wherein the cutout is arranged between a pair of adjacent first flexible printed circuit boards from among the plurality of first flexible printed circuit boards.

7. An electrooptic display device comprising:
a first substrate;
a second substrate superimposed and placed on a top surface of said first substrate;
a third substrate spaced apart from said first substrate and said second substrate, an edge surface of the third substrate facing said first substrate and said second substrate;
a plurality of first flexible printed circuit boards each including one end electrically connected to the top surface of said first substrate, and another end electrically connected to a top surface of said third substrate; and
a second flexible printed circuit board electrically connected to said second substrate, the second flexible printed circuit board extending in parallel to said first flexible printed circuit boards,
wherein said third substrate includes a recess in a portion overlapping said second flexible printed circuit board in a plan view,
said second flexible printed circuit board is placed in said recess so as to extend under said first flexible printed circuit boards when viewed in a cross-sectional direction parallel to the edge surface of said third substrate, and said second flexible printed circuit board extends over said third substrate.

8. The electrooptic display device according to claim 7, wherein
a plurality of said second flexible printed circuit boards is provided, and
said third substrate includes recesses in portions overlapping said second flexible printed circuit boards.

9. The electrooptic display device according to claim 7, wherein said recess has a shape along said second flexible printed circuit board.

10. The electrooptic display device according to claim 7, wherein said first substrate is a thin film transistor (TFT) substrate.

11. The electrooptic display device according to claim 7, wherein said second substrate is a touch panel.

12. The electrooptic display device according to claim 7, wherein said second flexible printed circuit board is placed on the top surface of said third substrate.

13. The electrooptic display device according to claim 7, wherein the recess is arranged between a pair of adjacent first flexible printed circuit boards from among the plurality of first flexible printed circuit boards.

* * * * *